United States Patent [19]

Asato et al.

[11] Patent Number: 5,133,069
[45] Date of Patent: Jul. 21, 1992

[54] TECHNIQUE FOR PLACEMENT OF PIPELINING STAGES IN MULTI-STAGE DATAPATH ELEMENTS WITH AN AUTOMATED CIRCUIT DESIGN SYSTEM

[75] Inventors: Creighton S. Asato, Sunnyvale; Suresh K. Dholakia; Christoph Ditzen, both of San Jose, all of Calif.

[73] Assignee: VLSI Technology, Inc., San Jose, Calif.

[21] Appl. No.: 297,112

[22] Filed: Jan. 13, 1989

[51] Int. Cl.[5] .......................... G06F 15/31; G06F 9/38
[52] U.S. Cl. .................................. 395/800; 395/250; 364/489
[58] Field of Search ........... 364/200, 900, 754, 728.06, 364/757, 750.5, 784, 489, 490, 491

[56] References Cited

U.S. PATENT DOCUMENTS

| | | | |
|---|---|---|---|
| 3,875,391 | 4/1975 | Shapiro et al. | 364/200 |
| 4,556,948 | 12/1985 | Mercy | 364/757 |
| 4,736,333 | 4/1988 | Mead et al. | 364/736 |
| 4,736,335 | 4/1988 | Barkan | 364/758 |
| 4,807,183 | 2/1989 | Kung | 364/900 |
| 4,811,260 | 3/1989 | Abe et al. | 364/724.01 |
| 4,887,233 | 12/1989 | Cash et al. | 364/757 |
| 4,910,700 | 3/1990 | Hartley et al. | 364/754 |

OTHER PUBLICATIONS

C. E. Hauck et al., "The Systematic Exploration of Pipelined Array Multiplier Performance," Proceedings of the IEEE International Conference on Acoustics, Speech and Signal Processing, Tampa, Fla., Mar. 26-29, 1989, pp. 1461-1464.

J. R. Jump et al., "Effective Pipelining of Digital Systems," IEEE Transactions on Computers, vol. C-27, No. 9, Sep. 1978, pp. 855-865.

C. Asato et al., "A Datapath Multiplier with Automatic Insertion of Pipeline Stages," IEEE Proceedings of the Custom Integrated Circuits Conference, San Diego, Calif., May 15-18, 1989.

Jump et al., "Effective Pipeling of digital Systems", IEEE Transactions on Computers, vol. C-27, No. 9 (Sep. 1978), pp. 855-865.

Primary Examiner—Thomas C. Lee
Assistant Examiner—Robert B. Harrell
Attorney, Agent, or Firm—Burns, Doane, Swecker & Mathis

[57] ABSTRACT

According to a method for designating the locations of pipelining stages in multi-stage datapath elements, the delay associated with each stage of the multi-stage element is estimated. Then, beginning with a designated stage of the multi-stage element, the estimated delays for the individual stages are added to obtain an accumulated delay time. Whenever the accumulated delay time exceeds a desired cycle time, a pipelining stage is inserted into the multi-stage element prior to the stage which caused the accumulated delay time to exceed the desired operating cycle time. Then, the method is continued for succeeding stages in the datapath element until all of its stages have been accounted for.

20 Claims, 5 Drawing Sheets

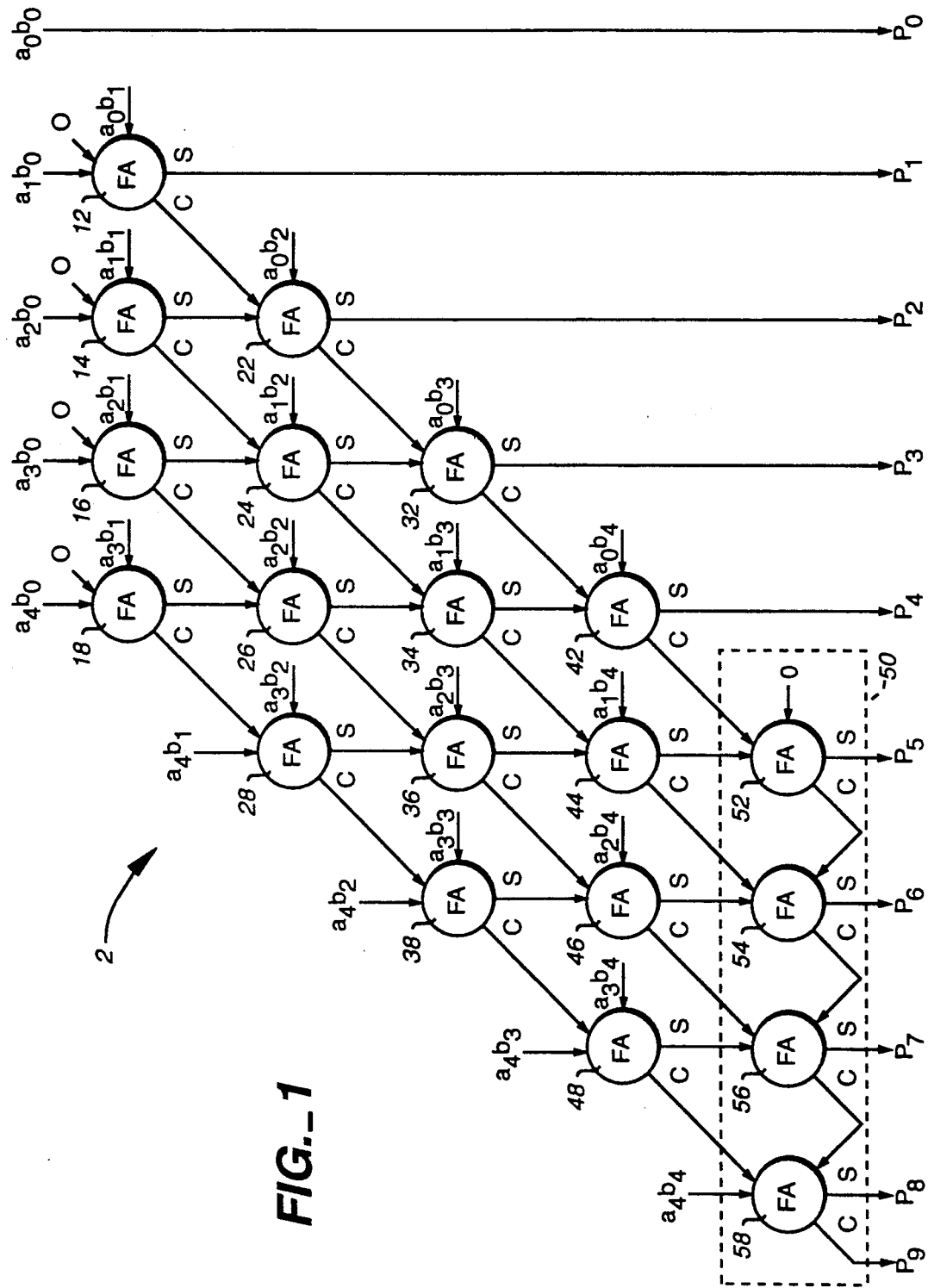
FIG._1

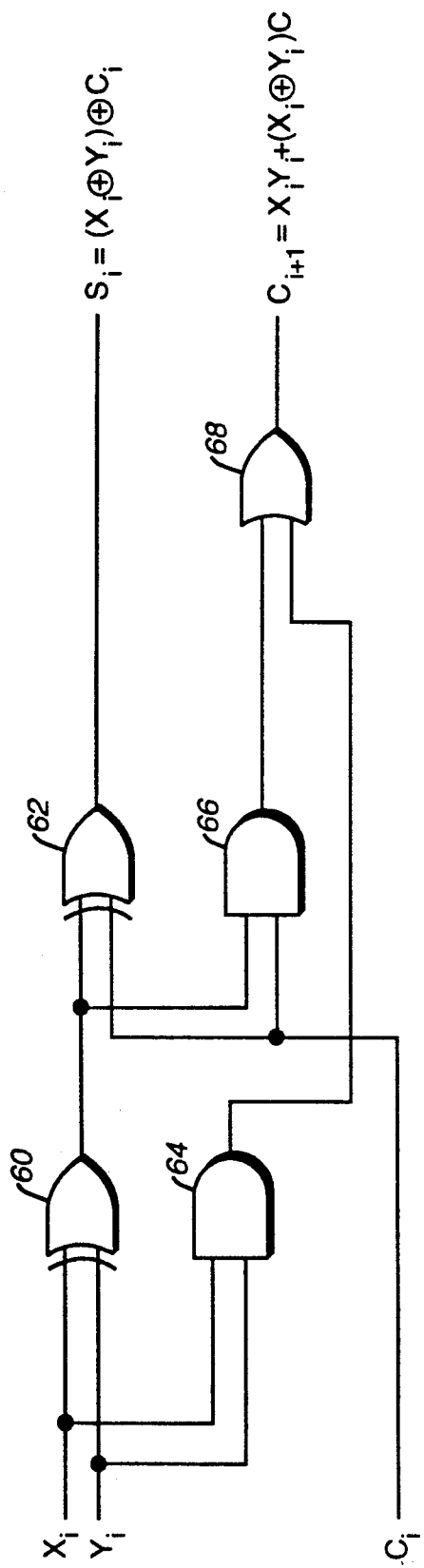
FIG._2
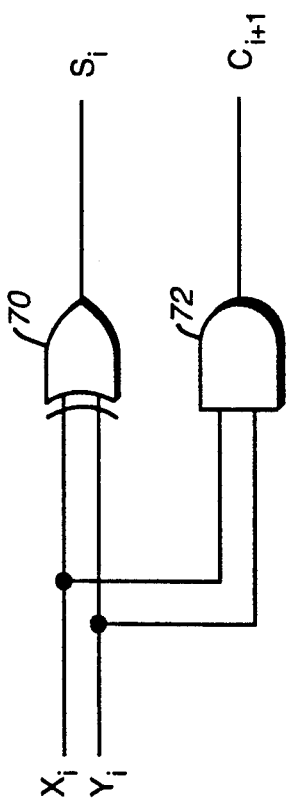
FIG._3

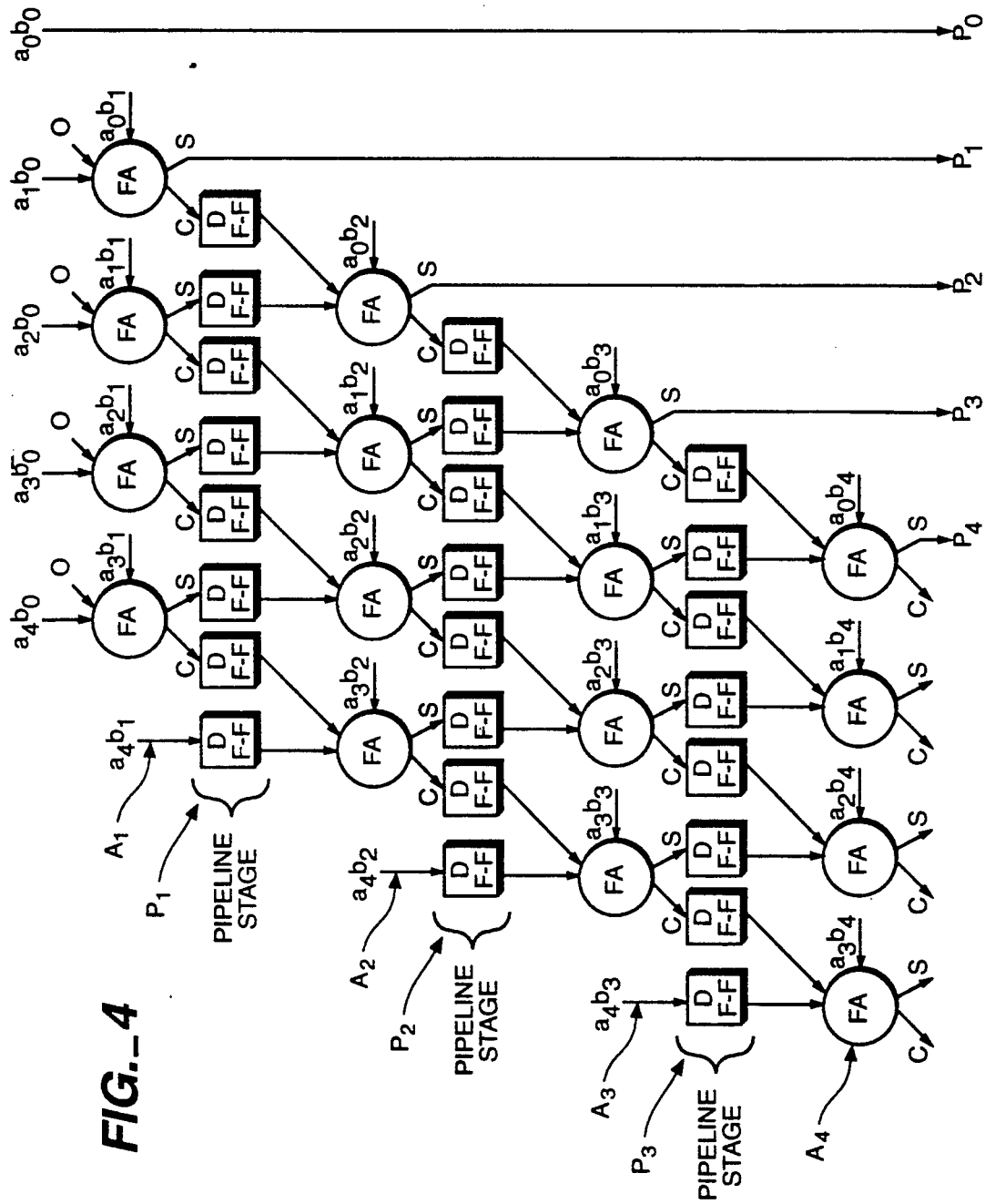
FIG._4

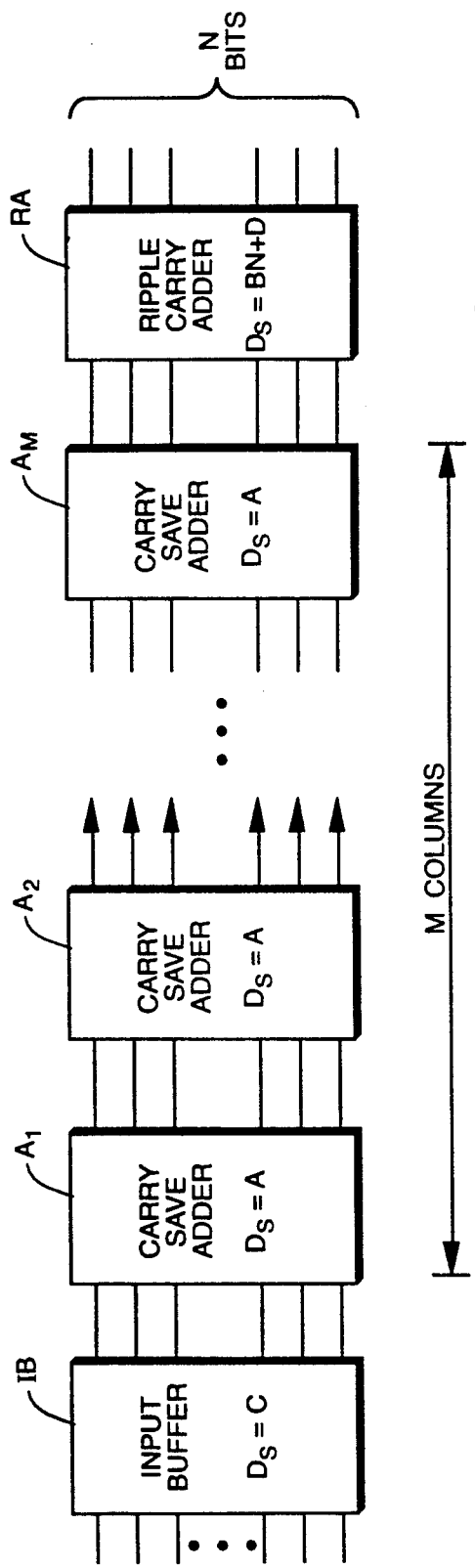
FIG._5
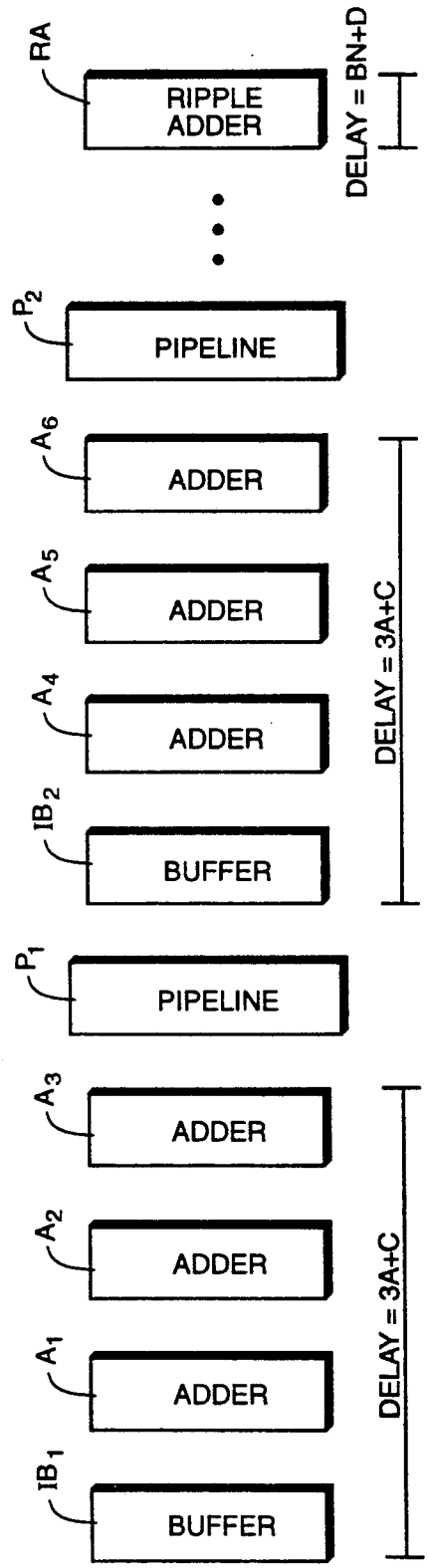
FIG._6

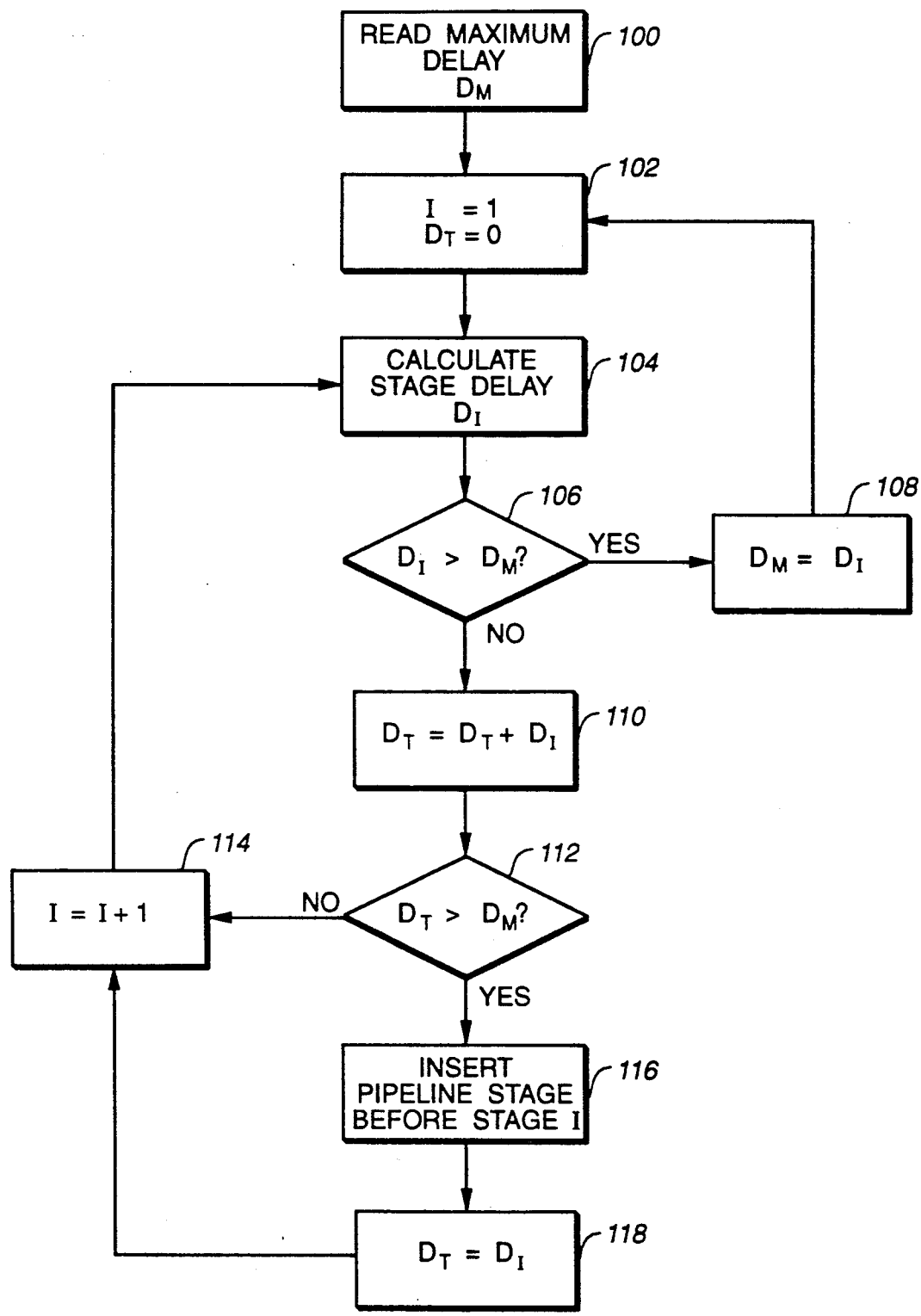
FIG._7

TECHNIQUE FOR PLACEMENT OF PIPELINING STAGES IN MULTI-STAGE DATAPATH ELEMENTS WITH AN AUTOMATED CIRCUIT DESIGN SYSTEM

BACKGROUND OF THE INVENTION

1. Field of the Invention

The present invention generally relates to techniques for producing high-speed data processing elements and, more particularly, the present invention relates to techniques for producing multi-stage datapath elements with selectively-inserted pipelining stages.

2. State of the Art

Logical data processing elements, such as inverters, typically operate on each bit in a datapath individually. In such elements, an operation on one bit has little, if any, effect on operations on another bit in the datapath. However, with high-speed arithmetic units, such as multipliers, an operation on one bit in a datapath is often dependent upon the results from processing other bits. For instance, in binary multipliers, a carry bit is often generated during an operation on a lower order bit and, then, the carry bit is used in an operation on a higher order bit in the multiplier.

To provide high frequency operation of arithmetic functional units, so-called pipelining stages can be inserted in the units. Although pipelining stages in arithmetic elements have numerous advantages, they also can increase latency times (the period of time required to completely process a word). In other words, because pipelining stages add additional processing steps to arithmetic elements, the elements require longer periods of time to process each individual word. Nevertheless, an arithmetic element's output frequency (i.e., the number of words processed per unit time) may be increased, despite increased latency, by the insertion of pipelining stages in the element. This result follows from the fact that pipelining stages permit an element to begin operating on the next word before the element completes processing of a previous word. Accordingly, although pipelining stages increase element latency times, they also increase the frequency of operation of arithmetic elements.

Thus, the use of pipelining stages necessitates making performance trade-offs between frequency and latency. To achieve optimal or near optimal performance, it is desirable to insert only the minimum number of pipeline stages needed to achieve a desired operating frequency. Stated somewhat differently, pipeline stages ordinarily should be inserted at maximal distances into a functional element.

For practical purposes, the operating frequency of a particular datapath element often is controlled by adjacent functional elements. Accordingly, when an arithmetic element is designed for compatibility with other elements in an existing datapath, any pipeline stages placed in the newly designed element should be located at optimal positions given the other elements in the datapath and given the required operating frequency of the newly designed element.

BRIEF SUMMARY OF THE INVENTION

The present invention generally relates to a method for determining the positions for pipelining stages in a multi-stage datapath element. According to the method, the delay associated with each stage of the functional element is estimated. Then, beginning with an initially-designated stage of the datapath element, the estimated delays for consecutively-adjacent stages are added to obtain a cumulative delay time. Whenever the magnitude of the cumulative delay time exceeds the desired cycle time for the multi-stage element, the method designates the insertion of a pipelining stage prior to the consecutively-adjacent stage which caused the accumulated delay time to exceed the desired operating cycle time. Then, the method is continued for succeeding stages in the datapath element until all of its stages have been accounted for.

BRIEF DESCRIPTION OF THE DRAWING

In the accompanying drawing:

FIG. 1 is a schematic diagram of a conventional 5×5 unsigned carry-save array multiplier;

FIG. 2 is a schematic logic circuit illustrating a full adder circuit which for use with the multiplier of FIG. 1;

FIG. 3 is a schematic logic circuit illustrating a half adder circuit which for use with the multiplier of FIG. 1;

FIG. 4 is a schematic circuit of a portion of a 5×5 unsigned carry-save array multiplier including pipeline stages;

FIG. 5 is a diagram which is provided to assist in explaining a technique for estimating delays encountered in an N×M array multiplier;

FIG. 6 is a functional representation of an NxM array multiplier with pipelining stages; and FIG. 7 is a flow diagram illustrating a process for determining the placement of pipelining stages in multi-stage datapath elements.

DETAILED DESCRIPTION OF THE PREFERRED EMBODIMENT

In the following, the present invention will be described in the context of a carry-save array multiplier. However, this embodiment is merely illustrative of elements which operate on a parallel data in a datapath. That is, it should be understood that the present invention is applicable to arithmetic operators other than array multipliers.

A conventional 5×5 carry-save array multiplier 2 is illustrated in FIG. 1. The multiplier 2 is designed for high-speed multiplication of two five-bit numbers A and B. In symbolic terms, the number A includes, from least significant bit to most significant bit, bits $a_0$, $a_1$, $a_2$, $a_3$ and $a_4$. Likewise, the five bit number B includes bits $b_0$, $b_1$, $b_2$, $b_3$ and $b_4$.

The multiplier 2 in FIG. 1 comprises a plurality of rows, or stages, of full adders each designated by the letters FA. Thus, the first row of the multiplier includes full adders 12, 14, 16 and 18; the second row includes full adders 22, 24, 26 and 28; the third row includes full adders 32, 34, 36 and 38; and the fourth row includes full adders 42, 44, 46 and 48. The final stage of multiplier 2 is a ripple-carry adder 50 comprised of a row of full adders 52, 54, 56 and 58.

In operation of multiplier 2 of FIG. 1, each full adder receives three bit inputs and produces a sum output and a carry output. The bit inputs to the various adders in FIG. 1 are listed in Table 1. The sum outputs of the full adders are designated by the subscript "s" and the carry outputs are designated by the subscript "c". Thus, for example, the sum and carry outputs of adder 14 are designated 14s and 14c, respectively. The "$a_ib_j$" inputs listed in Table 1 designate the respective bits of numbers A and B which are logically combined by the AND operation at each of the adders.

| ADDER | INPUTS | ADDER | INPUTS |
|---|---|---|---|
| 12 | $0, a_1b_0, a_0b_1$ | 36 | $26c, 28s, a_2b_3$ |
| 14 | $0, a_2b_0, a_1b_1$ | 38 | $28c, a_4b_2, a_3b_3$ |
| 16 | $0, a_3b_0, a_2b_1$ | 42 | $32c, 34s, a_0b_4$ |
| 18 | $0, a_4b_0, a_3b_1$ | 44 | $34c, 36s, a_1b_4$ |
| 22 | $12c, 14s, a_0b_2$ | 46 | $36c, 38s, a_2b_4$ |
| 24 | $14c, 16s, a_1b_2$ | 48 | $38c, a_4b_3, a_3b_4$ |
| 26 | $16c, 18s, a_2b_2$ | 52 | $42c, 44s, 0$ |
| 28 | $18c, a_4b_1, a_3b_2$ | 54 | $44c, 46s, 52c$ |
| 32 | $22c, 24s, a_0b_3$ | 56 | $46c, 48s, 54c$ |
| 34 | $24c, 26s, a_1b_3$ | 58 | $48c, a_4b_4, 56c$ |

TABLE 1

In a typical system employing multiplier 2 of FIG. 1, an input buffer would be provided prior to the multiplier to store the multiplicands and multipliers which are processed by the multiplier. Additionally, a typical system would employ AND gates connected between the input buffer and the adder stages to assure that the $a_ib_j$ inputs to the multiplier are appropriately delayed to achieve synchronization between the stages. Such buffers and gate circuits are known in the art and, for that reason, are not further described herein.

The operation of multiplier 2 will now be explained. For purposes of such explanation an example will be provided in which the binary numbers A=10011 and B=01100 are multiplied. (For numbers with the base ten, A=19 and B=12.) With paper and a pencil, the multiplication could be written as follows:

```
    19   =    10011      MULTIPLICAND
   x12   =   x01100      MULTIPLIER
                00000
               00000
   108         10011
   120        10011
              00000
   ---      ---------
   228      011100100    PRODUCT
```

Accordingly, the process of multiplying two binary numbers can be understood to be achieved by successive additions and shifting In the above-illustrated multiplication process, it should be noted that the successive bits of the multiplier are looked at with the least significant bit first. If the multiplier bit is a ONE, the multiplicand is copied down; otherwise ZEROs are copied down. Then, the numbers in successive rows are shifted one position to the left from the previous row. Finally, the numbers are added, with the sum equalling the product of the multiplication operation.

To illustrate multiplication of the numbers AxB=P by multiplier 2 of FIG. 1, the inputs and outputs for each successive stage will be set forth. In the first stage the adders 12, 14, 16 and 18 would receive input sets (0,0,0), (0,0,0), (0,0,0), (0,0,0), respectively, and would provide respective output sets (sum, carry) of (0,0), (0,0), (0,0), (0,0). The least significant bit of the product P is $P_o=a_ob_o=0$. Bit $P_1$ would be the sum output of adder 12 which, in this example, is ZERO. In the second stage, adders 22, 24, 26 and 28 would receive input sets (0,0,1), (0,0,1), (0,0,0), (0,0,0) and would provide output sets (1,0), (1,0), (0,0), (0,0). Bit $P_2$ is the sum output of adder 22, which is ONE in this case. The respective inputs to the third stage adders 32, 34, 36 and 38 would be (0,1,1), (0,0,1), (0,0,0), (0,1,0) and the respective outputs would be (0,1), (1,0), (0,0), (1,0). Bit $P_3$ is the sum output of adder 32, which is ZERO. Next, the fourth stage inputs would be (1,1,0), (0,0,0), (0,1,0), (0,1,0) and the respective outputs would be (0,1), (0,0), (1,0), (1,0). Bit $P_4$, the sum output of adder 42, is ZERO in this example.

Further in operation of multiplier 2 of FIG. 1 according to the preceding example, the first adder 52 of ripple carry adder 50 receives input set (1,0,0) and provides output (1,0). Thus, bit $P_5$ is ONE. The adder 54 receives, in turn, the input set (0,1,0) and outputs (1,0). Bit $P_6$ is thus ONE. Adder 56 receives (0,1,0) and outputs (1,0); and adder 58 receives (0,0,0) and outputs (0,0). Accordingly bits $P_7$ and $P_8$ are ONE and ZERO, respectively. As can be seen, the product P ($P_8P_7P_6P_5P_4P_3P_2P_1P_0$) is 011100100, which corresponds with the result illustrated obtained above by the successive addition and shifting technique.

FIG. 2 shows an example of a full adder. In this example, the full adder is implemented by a combination of two XOR gates 60 and 62, two AND gates 64 and 66, and an OR gate 68. The sum of bits $X_i$ and $Y_i$ and an input carry bit $C_i$ can be expressed as $X_i \oplus Y_i \oplus C_i = (X_i \oplus Y_i) \oplus C_i$. Thus, bits $X_i$ and $Y_i$ are supplied to the input gates of first XOR gate 60. The output of XOR gate 60 is then supplied to an input terminal of XOR gate 62, which receives the bit $C_i$ as a second input. The output of XOR gate 62 represents the sum of the input bits.

Further with regard to FIG. 2, it should be understood that the carry output may be expressed as $C_{i+1} = X_iY_i + X_iC_i + Y_iC_i$. By manipulating this expression according to the rules of Boolean algebra, the carry output can be expressed as $C_{i+1} = X_iY_i + (X_i \oplus Y_i)C_i$. Thus, in the system of FIG. 2, bits $X_i$ and $Y_i$ are supplied to the input terminals of AND gate 64. An AND gate 66 has input terminals connected to the output of XOR gate 60 and to input carry bit $C_i$ to produce the resulting expression $(X_i \oplus Y_i)C_i$. Finally, the outputs of AND gate 64 and AND gate 66 are connected to the input terminals of OR gate 68 to produce the output carry bit $C_{i+1}$.

Referring again to FIG. 1, it can be seen that full adders 12, 14, 16 and 18 each have one input set at ZERO. This allows the first stage of each of the full adders to be replaced by a stage of half-adder circuits to minimize circuitry. An example of a suitable half-adder circuit is shown in FIG. 3. The illustrated half-adder circuit includes a XOR gate 70 and an AND gate 72, each having input terminals connected to receive input bits $X_i$ and $Y_i$. The XOR gate 70 determines the sum output $S_i = X_i \oplus Y_i$, and the AND gate 72 determines the output carry $C_{i+1} = X_iY_i$.

In practice, a carry-save array multiplier 2 such as illustrated in FIG. 1 can produce the product of two numbers A and B relatively quickly. In other words, such circuits have relatively little latency as expressed in terms of clock cycles. However, such circuits are also characterized by the fact that they must completely process one set of numbers before they can begin multiplying a new set of numbers. More specifically stated, the multiplier 2 of FIG. 1 must wait at least for the carry bit from adder 12 to propagate completely through adders 22, 32, 42, 52, 54, 56 and 58 before the most significant bit $P_8$ of the product P is determined. Then, and only then, can the multiplier begin processing another set of numbers to be multiplied. Thus, despite its high speed with respect to multiplying any given pair of numbers, the output frequency of the multiplier 2 of FIG. 1 is relatively slow in terms of the number of different numbers which can be multiplied in a given time period. Additionally, it can be said that the overall efficiency of the circuit of FIG. 1 is low because the individual full-adders in the circuit are idle during most of the processing cycle.

To increase the output frequency of multi-stage datapath elements such as multiplier 2 of FIG. 1, pipelining stages can be inserted between one or more of these stages. These pipelining stages are, in essence, storage registers which store partial results produced by a preceding functional stage. Also, in multipliers, pipelining stages can be used to store the multiplier and multiplicand for processing in the later adder stages. In its simplest implementation, a pipelining stage usually consists of two to four D-type flip-flops where each flip-flop functions to temporarily store a single output bit from the previous adder stage as well as a single input bit for a following stage. The advantage of inserting a pipelining stage in a multi-stage datapath element such as a multiplier is that, after an adder stage transfers its partial products to a pipelining stage, the adder stage is freed to being processing another set of numbers.

FIG. 4 shows a carry-save array multiplier having pipelining stages $P_1$, $P_2$ and $_3$ inserted between adder stages $A_1$, $A_2$, $A_3$ and $A_4$. Specifically, pipelining stage $P_1$ is inserted between adder stages $A_1$ and $A_2$; pipelining $P_2$ is inserted between adder stages $A_2$ and $A_3$; and pipelining stage $P_3$ is inserted between adder stages $A_3$ and $A_4$. For the sake of simplicity, only the first few stages of the multiplier are shown. By use of the pipeline stages, the multiplier of FIG. 4 can provide a higher output frequency, since the multiplier is able to begin processing a second pair of numbers before it complete the processing of a first pair of numbers. The pipelining stages, however, increases the number of stages through which the partial products must propagate in the multiplier. Accordingly, the pipelining stages will ordinarily increase the latency of the multiplier.

At this juncture, it should be realized that it is not necessarily required or practical to insert pipelining stages between each adder stage in an arithmetic unit such as a multiplier. Also, it should be realized that the delays through the different adder stages in the multiplier of FIG. 1 are not necessarily the same. For instance, the ripple carry adder 50 typically requires more time to complete its processing cycle than does any one of the first four adder stages and, hence, has a greater delay. Accordingly, rather than placing pipelining stages between each of the stages of the multiplier, it might be more practical, for instance, to place pipelining stages only after the second and fourth adder stages. In that case, the operating frequency of the multiplier would be determined by the maximum delay through the processing stages that are located between two pipeline stages. According to this example, hardware requirements would be reduced while, nevertheless, increasing the multiplier's output frequency and minimizing the increase in its latency.

To determine the minimal, or near minimal, number of pipeline stages which are required to be added to a multi-stage element such as the multiplier of FIGS. 1 and 4, it is necessary to determine the delay through the individual stages of the element. One way of estimating those delays is by modelling an element at the gate level (i.e., gate by gate). According to the gate-level modelling method, datapath elements are considered in terms of their component individual gates, each having an associated delay; then, the sum of the delays through all of the gates along a path provides an estimate of the total delay of the datapath element. For example, the delay through the full adder of FIG. 2 could be estimated by summing the delays along the path comprised of the two XOR gates 60 and 62. However, the gate-level approach to modelling delays is not always efficient. The inefficiencies in the methodology arise because, in elements having parallel data paths, gates can be sometimes removed without changing the maximum delay of the overall element. Moreover, gate-level modelling usually is time-consuming and calculation intensive. Because of such deficiencies, gate-level modelling is considered to be impractical in most circumstances.

Another known method of estimating delays through datapaths is by modelling the delays of a datapath element-by-element. However, such element-level modelling has the shortcoming that it does not indicate whether the timing of the datapath will change when pipeline stages are added to the elements in the datapath. Moreover, element-level modelling does not indicate the positions in elements at which pipeline stages should be added to decrease the cycle time of a datapath.

Thus, a modelling method is needed for estimating delays encountered in individual stages of multi-stage datapath elements. In one modelling method which meets this need, the delay through the stages of datapath elements can be modelled by a functional relationship depending, inter alia, upon the number of bits in communication with a stage of a datapath element. For example, one particularly suitable modelling equation is:

$$D_s = D_b N_b + C \tag{1}$$

where $D_s$ is the stage delay, $D_b$ is a delay which is proportionate to the number of bits in the datapath element, $N_b$ is the number of bits in the datapath element, and C is a constant which represents a delay which is independent of the number of bits in the datapath. For stages in which operations upon a bit re not dependent operations on other bits, $D_b$ is set equal to zero.

The preceding equation (1) can be readily applied to ripple-carry adders such as are typically found in adders, ALU's and multiplier elements. Such adders have delays which result from communications within the elements and which, therefore, can be estimated as being proportionate to the number of bits in the datapath element. On the other hand, components of elements which do not exchange or communicate signals do not have delays which are proportionate to the number of bits in the datapath. Thus, for components of an element that have no bit-dependent delay, the parameter $D_b$ can be set to zero.

To illustrate the use of equation (1) for estimating delays through multi-stage datapath elements, reference will be made to FIG. 5. In FIG. 5, an $N \times M$ bit array multiplier consists of M columns of carry-save adders $A_1$, $A_2$ ... $A_M$ and an N bit column composed of a ripple-carry adder RA. An input buffer IB is provided before the first adder stage $A_1$ to temporarily store the multiplicand and the multiplier. As illustrated in FIG. 5, the input buffer stage IB has an estimated stage delay $D_s$ equal to C, each carry-save adder $A_1$, $A_2$ ... $A_M$ has an estimated delay of A, and the final ripple-carry adder RA has an estimated delay of $BN+D$.

By applying equation (1) to the multiplier of FIG. 5, the delay through the first four stages can be modelled as C+3A. The delay through the three middle stages can be modelled as 3A. The delay through the final ripple-carry adder can be modelled as BN+D. Finally, the entire NxM bit multiplier could be modelled as having total estimated delay of AM+BN+C+D, where A is the constant delay through the carry-save adder, B is the delay per bit for the ripple-carry adder, C is the input buffer delay, and D is the constant delay of the ripple-carry adder.

In FIG. 6 there is shown a multi-stage datapath element comprising the multiplier of FIG. 5 with pipelining stages inserted such that there is a pipelining stage after every third carry-save adder. Thus, the modified multiplier would include a plurality of segments having a delay of 3A+C and a final segment (i.e., the ripple carry adder stage) having a delay of BN+D. It should be noted that each adder stage would require an additional input buffer to store the multiplicand and multiplier for processing by the particular segment. Also, with the pipeline stages inserted at the indicated locations, the minimum cycle time of the multiplier would be the sum of the delays introduced by the pipeline stages plus the maximum of 3A+C and BN+D.

It can now be understood that the above-described modelling technique reflects the fact that multi-stage datapath elements generally include repetitive logic cells. By recognizing this repetitiveness, the modelling technique provides sufficient detail for determining pipelining stage placement while requiring relatively less processing time or computational capacity than gate-level modelling.

a more generalized technique for inserting pipelining stages in multi-stage datapath elements will be discussed with reference to FIG. 7. This technique may be incorporated, for example, into automated integrated circuit design systems.

The initial step 100 in the process diagrammed in FIG. 7 is to select a maximum desired delay $D_M$. This delay is normally approximately equal to the inverse of the desired operating frequency of a datapath element and might, for example, be determined by operating frequencies of other functional elements in the datapath. Also initially, an element stage in step 102 counter I is initialized to zero and an accumulated delay variable $D_T$ is set to zero.

The next step 104 in the process diagrammed in FIG. 7 is to calculate the delay associated with an initially designated stage of the element. In practice, the initially designated stage is usually the last data-processing stage of the element to be analyzed. For the designated stage, the calculated stage delay, $D_I$, is then compared with the maximum delay $D_M$ in step 106. If the delay $D_I$ of the initially-designated stage is greater than the maximum delay $D_M$, the maximum delay $D_M$ is reset in step 108 to a value equal to the individual stage delay and the process is begun again. Otherwise, step 110 increments the total accumulated delay $D_T$ by the stage delay time of the next adjacent stage of the element. The incremented total delay $D_T$ is then compared in step 112 with the maximum delay time $D_M$. If the value $D_T$ is less than the value $D_M$, the stage counter is incremented by step 114 and the delay is calculated in step 104 for the next stage.

In practice, the process diagrammed in FIG. 7 is continued until step 112 identifies a stage of the datapath element whose addition causes the accumulated delay $D_T$ to exceed the maximum delay $D_M$. At that time, a pipelining stage is inserted by step 116 prior to the identified stage and step 118 sets the accumulated delay $D_T$ equal to the delay of the identified stage plus the delay inherent to the added pipelining stage. (In terms of data flow through a multi-stage element wherein the initially designated stage is the last data-flow stage, the pipelining stage would be inserted "downstream" from the stage which caused the accumulated delay $D_T$ to exceed the maximum delay $D_M$.) Then, the stage counter is incremented at step 114, and the process is continued at step 104 with consideration of the next stage of the element. The process proceeds in the above-described manner through each of the individual stages of the datapath element.

At this juncture, it can be appreciated that the essence of the above-described process is that the cumulative delay through a multi-stage datapath element is calculated stage-by-stage and, whenever a considered stage would result in a cumulative delay greater than the desired maximum delay, a pipelining stage is inserted in the element. In this way, the pipelining stages are placed within an element at maximum, or near maximum, distances from one another. The result of the above-described process, therefore, is to increase operating frequency of a multi-stage datapath element with only minimal increase in its latency.

In practice, it is often desirable that the maximum delay $D_M$ associated with an initially designated stage of an element reflect, additionally, the delay through an independent element which precedes, or follows, the designated stage on terms of data flow. (Where the initially designated stage of an element is the last data-processing stage of the element, the independent element would be one that followed the initially designated element in terms of data flow; on the other hand, where the initially designated stage of an element is its first data processing stage, the independent element would precede the initially designated element.) Also in practice of the above-described process, account must be taken of set-up and output delay times as well as the delay of any pipelining stages in the element. Such pipelining stages include ones which reside in an element prior to the above-described analyses as well as ones added to the element as a result of the analysis.

Although the principles, preferred embodiments and modes of operation of the present invention have been described in the foregoing specification, the invention which is intended to be protected herein is not to be construed as limited to the particular forms disclosed. Rather, the disclosed forms are to be regarded as illustrative rather than restrictive. Those skilled in the art will recognize that variations and changes may be made without departing from the spirit and scope of the invention.

What is claimed is:

1. A method implemented on a computer for placing pipelining stages in multi-stage datapath elements with an automated integrated circuit design system, comprising the steps of:
   a) obtaining a desired operating cycle time for a multi-stage datapath element;
   b) estimating a delay associated with an initially-designated stage of the multi-stage element;
   c) setting an accumulated delay value which reflects the estimated delay associated with the initially-designated stage;

d) estimating a delay associated with a consecutively adjacent stage of the multi-stage element;

e) incrementing the accumulated delay value by the estimated delay associated with the consecutively adjacent stage;

f) comparing the accumulated delay value with the desired operating cycle time and, when the magnitude of the accumulated delay exceeds the desired cycle time, designating insertion of a pipelining stage prior to the consecutively adjacent stage and setting said accumulated delay value equal to the estimated delay associated with the consecutively adjacent stage; and g) repeating steps d through f in said automated integrated circuit design system for succeeding stages until all stages of the multi-stage datapath element have been analyzed.

2. The method of claim 1, including the additional step of comparing the estimated delay associated with each stage of said multi-stage datapath element with the desired cycle time and, if the estimated delay associated with any individual stage exceeds the desired cycle time, resetting said desired cycle time equal to the estimated delay of the individual stage which exceeds the desired cycle time, and repeating steps a through g.

3. The method of claim 2, wherein said multi-stage datapath element is a carry-save array multiplier including a plurality of stages consisting of carry-save adder stages followed by a ripple-carry adder stage.

4. The method of claim 3, wherein at least one of said stage delay estimating steps estimates the delay associated with an individual stage in accordance with the equation:

$$D_s = D_b N_b + C$$

where $D_s$ is the estimated stage delay, $D_b$ is a delay associated with communication between bits in a considered stage, $N_b$ is the number of bits in the datapath element, and C is a constant.

5. The method of claim 1, wherein said multi-stage datapath element is a carry-save array multiplier including a plurality of stages consisting of carry-save adder stages followed by a ripple carry adder stage.

6. The method of claim 5, wherein at least one of said stage delay estimating steps estimates the delay associated with an individual stage in accordance with the equation:

$$D_s = D_b N_b + C$$

where $D_s$ is the estimated stage delay, $D_b$ is a delay associated with communication between bits in a considered stage, $N_b$ is the number of bits in the datapath element, and C is a constant.

7. The method of claim 1, wherein at least one of said stage delay estimating steps estimates the delay associated with an individual stage in accordance with the equation:

$$D_s = D_b N_b + C$$

where $D_s$ is the estimated stage delay, $D_b$ is a delay associated with communication between bits in a considered stage, $N_b$ is the number of bits in the datapath element, and C is a constant.

8. The method of claim 1 wherein the delay associated with the initially-designated stage includes the delay of an independent element.

9. The method of claim 8 wherein the initially designated stage of the element is the last stage in terms of data flow 10. The method of claim 9 wherein the independent element follows the multi-stage element in terms of data flow.

11. The method of claim 1 wherein the delay associated with the initially-designated stage includes the delay of an independent which precedes the multi-stage element in terms of data flow.

12. A multi-stage datapath element having a preselected operating cycle time, which multi-stage element is produced with an automated circuit design system as a combination of functional stages and pipelining stages combined according to a method implemented on a computer of:

a) obtaining a desired operating cycle time for a datapath element;

b) estimating a delay associated with an initially-designated stage of said multi-stage element;

c) setting an accumulated delay value which reflects estimated delay associated with the initially-designated stage;

d) estimating a delay associated with a consecutively adjacent stage of said multi-stage element;

e) incrementing said accumulated delay value by the estimated delay associated with said consecutively adjacent stage;

f) comparing the accumulated delay value with the desired operating cycle time and, when the magnitude of the accumulated delay exceeds the desired cycle time, designating insertion of a pipelining stage prior to the consecutively adjacent stage and setting said accumulated delay value equal to the estimated delay associated with the consecutively adjacent stage; and g) repeating steps d through f with said automated circuit design system until all stages of the multi-stage datapath element have been analyzed.

13. The multi-stage element of claim 12 wherein the delay associated with the initially-designated stage includes the delay of an independent element.

14. The element of claim 13 wherein the initially-designated stage of the multi-stage element is the last stage in terms of data flow.

15. The multi-stage element of claim 14 wherein the independent element follows the multi-stage element in terms of data flow.

16. The method of claim 12 wherein the delay associated with the initially-designated stage includes the delay of an independent element which precedes the multi-stage element in terms of data flow.

17. The multi-stage element of claim 12, including the additional step of comparing the estimated delay associated with each stage of said multi-stage datapath element with the desired cycle time and, if the estimated delay associated with any individual stage exceeds the desired cycle time, resetting said desired cycle time equal to the estimated delay of the individual stage which exceeds the desired cycle time and repeating steps a through g.

18. The multi-stage element of claim 16 wherein said multi-stage datapath element is a carry-save array multiplier including a plurality of stages consisting of carry-save adder stages followed by a ripple-carry adder stage.

19. The multi-stage element of claim 17 wherein at least one of said stage delay estimating steps estimates the delay associated with an individual stage in accordance with the equation:

$$D_s = D_b N_b + C$$

where $D_s$ is the estimated stages delay, $D_b$ is a delay associated with communication between bits in a considered stage, $N_b$ is the number of bits in the datapath element, and C is a constant.

20. The multi-stage element of claim 12 wherein said multi-stage datapath element is a carry-save array multiplier including a plurality of stages consisting of carry-save adder stages followed by a ripple-carry adder stage.

* * * * *